United States Patent
Kuo et al.

(10) Patent No.: US 11,776,899 B2
(45) Date of Patent: Oct. 3, 2023

(54) VIA ARRAY DESIGN FOR MULTI-LAYER REDISTRIBUTION CIRCUIT STRUCTURE

(71) Applicant: MEDIATEK INC., Hsin-Chu (TW)

(72) Inventors: Che-Hung Kuo, Hsinchu (TW); Hsing-Chih Liu, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 248 days.

(21) Appl. No.: 17/179,357

(22) Filed: Feb. 18, 2021

(65) Prior Publication Data

US 2021/0351124 A1    Nov. 11, 2021

Related U.S. Application Data

(60) Provisional application No. 63/022,626, filed on May 11, 2020.

(51) Int. Cl.
    *H01L 23/522*    (2006.01)
    *H01L 23/31*     (2006.01)

(52) U.S. Cl.
    CPC ...... *H01L 23/5226* (2013.01); *H01L 23/3114* (2013.01); *H01L 23/3128* (2013.01)

(58) Field of Classification Search
    None
    See application file for complete search history.

(56) References Cited

U.S. PATENT DOCUMENTS

| | | | |
|---|---|---|---|
| 2004/0069529 A1* | 4/2004 | Oggioni | H01P 3/06 174/262 |
| 2005/0098348 A1* | 5/2005 | Okumichi | H01L 23/66 174/262 |
| 2010/0097172 A1 | 4/2010 | Tonouchi | |
| 2012/0018193 A1 | 1/2012 | Hong | |
| 2012/0326293 A1 | 12/2012 | Kobayashi | |
| 2019/0373727 A1 | 12/2019 | Hayashi | |
| 2019/0393172 A1* | 12/2019 | Pietambaram | H01L 24/19 |

FOREIGN PATENT DOCUMENTS

| | | |
|---|---|---|
| EP | 1 506 701 A1 | 2/2005 |
| TW | 201737427 A | 10/2017 |
| TW | 201803051 A | 1/2018 |
| TW | 201810584 A | 3/2018 |
| WO | 2010/018790 A1 | 2/2010 |

* cited by examiner

*Primary Examiner* — Jay C Chang
(74) *Attorney, Agent, or Firm* — Winston Hsu

(57) ABSTRACT

An interconnect structure for a redistribution layer includes an intermediate via land pad; a cluster of upper conductive vias abutting the intermediate via land pad and electrically coupling the intermediate via land pad to an upper via land pad; and an array of lower conductive vias electrically coupling the intermediate via land pad with a lower circuit pad. The array of lower conductive vias is arranged within a horseshoe-shaped via array region extending along a perimeter of the intermediate via land pad. The array of lower conductive vias arranged within the horseshoe-shaped via array region does not overlap with the cluster of upper conductive vias.

19 Claims, 4 Drawing Sheets

VIA ARRAY DESIGN FOR MULTI-LAYER REDISTRIBUTION CIRCUIT STRUCTURE

CROSS REFERENCE TO RELATED APPLICATIONS

This application claims priority from U.S. provisional application No. 63/022,626 filed on May 11, 2020, the disclosure of which is included in its entirety herein by reference.

BACKGROUND

This invention relates generally to design and fabrication of multi-layer redistribution circuit structure. In particular, the invention relates to via array design for a multi-layer redistribution circuit structure of a fan-out package.

Advanced packaging technologies have been proposed for system integration as the design complexity increases in recent years. For example, the fan-out wafer-level chip-scale package (FO-WLCSP) provides a promising alternative with a small form factor, a better signal-to-noise ratio, and improved thermal characteristics.

As known in the art, micro-bumps and redistribution layers (RDLs) are used in a multi-chip FO-WLCSP to connect neighboring chips and to fan-out the input/output (I/O) pads on a chip. RDLs are the top metal layers of a chip, and multiple chips share the same RDLs in a multi-chip FO-WLCSP. In modern IC designs, I/O pads are usually placed along the boundaries of chips, and the RDLs are used to redistribute I/O pads to controlled collapse chip connection (C4) bump pads or connect I/O pads among different chips. The I/O pads can be re-distributed to the fan-out region outside the chips to increase the pin count.

C4 bumps are the interface between a fan-out chip package and a circuit substrate such as a packaging substrate. It is known that the C4 bumps are usually under larger stress due to mismatch of coefficient of thermal expansion (or CTE mismatch). Therefore, the size and pitch of the C4 bumps are greater than that of the I/O pad or micro-bumps. This results in that the C4 bump location may be different from its corresponding I/O pad or micro-bump location.

Typically, there are thousands of kinds of pad-to-bump (i.e. I/O pad to C4 bump pad) relative positions, and therefore thousands of kinds of via and land interconnect patterns are generated during the design of the RDL routing, which inevitably increases the runtime and makes the RDL circuit design process become burdensome.

SUMMARY

It is one object of the invention to provide an improved via array design for a multi-layer redistribution circuit structure of a fan-out package to solve the above-mentioned deficiencies or shortcomings.

According to one aspect of the invention, an interconnect structure for a redistribution layer includes an intermediate via land pad; a cluster of upper conductive vias abutting the intermediate via land pad and electrically coupling the intermediate via land pad to an upper via land pad; and an array of lower conductive vias electrically coupling the intermediate via land pad with a lower circuit pad, wherein the array of lower conductive vias is arranged within a horseshoe-shaped via array region extending along a perimeter of the intermediate via land pad.

According to some embodiments, the intermediate via land pad comprises a circular shape, a rectangular shape, a square shape, a polygonal shape, an oval shape or an irregular shape.

According to some embodiments, the upper via land pad comprises a circular shape, a rectangular shape, a square shape, a polygonal shape, an oval shape or an irregular shape.

According to some embodiments, the intermediate via land pad and the upper via land pad have same shape.

According to some embodiments, the intermediate via land pad and the upper via land pad have different shapes.

According to some embodiments, the cluster of upper conductive vias is disposed within a projected area of the upper via land pad on the intermediate via land pad.

According to some embodiments, the projected area is substantially equivalent to a top surface area of the upper via land pad.

According to some embodiments, rest portion of the intermediate via land pad outside the projected area is a ring-shaped area with a uniform width.

According to some embodiments, the ring-shaped area is divided into two mirror-symmetric horseshoe-shaped by a central line, and wherein one of the two mirror-symmetric horseshoe-shaped regions is defined as the horseshoe-shaped via array region.

According to some embodiments, the array of lower conductive vias electrically couples the intermediate via land pad with a lower circuit pad.

According to some embodiments, the intermediate via land pad and the upper via land pad are not concentric with respect to a central axis when viewed from above.

According to some embodiments, the array of lower conductive vias arranged within the horseshoe-shaped via array region does not overlap with the cluster of upper conductive vias.

According to another aspect of the invention, a semiconductor package includes at least one semiconductor die; a molding compound surrounding the semiconductor die; and a redistribution layer disposed on a lower surface of the molding compound. The at least one semiconductor die is electrically connected to an interconnect structure of the redistribution layer. The interconnect structure comprises an intermediate via land pad; a cluster of upper conductive vias abutting the intermediate via land pad and electrically coupling the intermediate via land pad to an upper via land pad; and an array of lower conductive vias electrically coupling the intermediate via land pad with a lower circuit pad. The array of lower conductive vias is arranged within a horseshoe-shaped via array region extending along a perimeter of the intermediate via land pad.

According to some embodiments, the cluster of upper conductive vias is disposed within a projected area of the upper via land pad on the intermediate via land pad.

According to some embodiments, the projected area is substantially equivalent to a top surface area of the upper via land pad.

According to some embodiments, rest portion of the intermediate via land pad outside the projected area is a ring-shaped area with a uniform width.

According to some embodiments, the ring-shaped area is divided into two mirror-symmetric horseshoe-shaped by a central line, and wherein one of the two mirror-symmetric horseshoe-shaped regions is defined as the horseshoe-shaped via array region.

According to some embodiments, the array of lower conductive vias electrically couples the intermediate via land pad with a lower circuit pad.

According to some embodiments, the intermediate via land pad and the upper via land pad are not concentric with respect to a central axis when viewed from above.

According to some embodiments, the array of lower conductive vias arranged within the horseshoe-shaped via array region does not overlap with the cluster of upper conductive vias.

According to still another aspect of the invention, an interconnect structure for a redistribution layer includes an intermediate via land pad; a cluster of upper conductive vias abutting the intermediate via land pad and electrically coupling the intermediate via land pad to an upper via land pad; and an array of lower conductive vias electrically coupling the intermediate via land pad with a lower circuit pad. The cluster of upper conductive vias is disposed within a projected area of the upper via land pad on the intermediate via land pad. The array of lower conductive vias is arranged on rest portion of the intermediate via land pad outside the projected area and does not overlap with the cluster of upper conductive vias.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DETAILED DESCRIPTION

Figure 1:
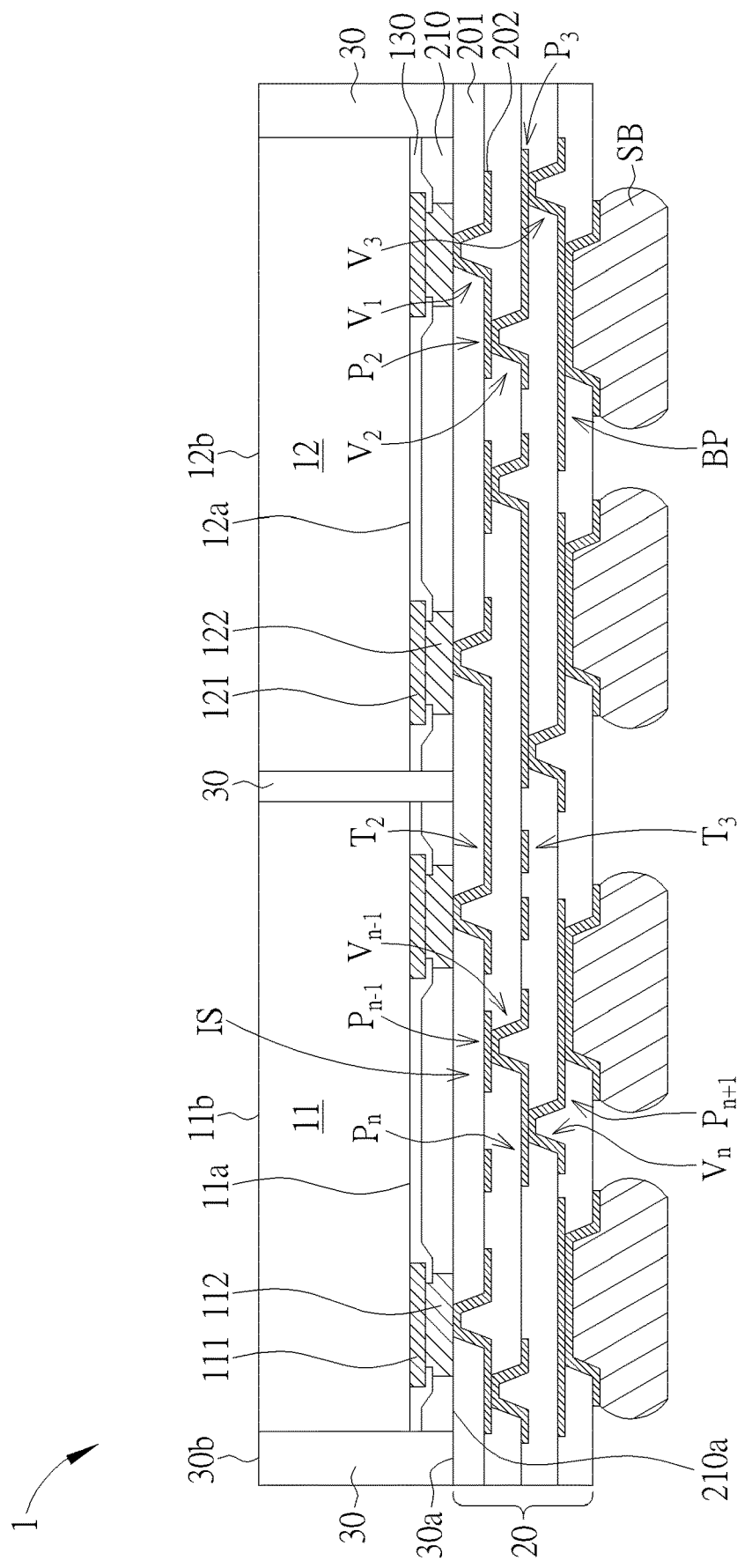
FIG. 1 is a schematic, cross-sectional diagram showing an exemplary fan-out package according to one embodiment of the invention.

In the following detailed description of embodiments of the invention, reference is made to the accompanying drawings, which form a part hereof, and in which is shown by way of illustration specific preferred embodiments in which the disclosure may be practiced.

These embodiments are described in sufficient detail to enable those skilled in the art to practice them, and it is to be understood that other embodiments may be utilized and that mechanical, chemical, electrical, and procedural changes may be made without departing from the spirit and scope of the present disclosure. The following detailed description is, therefore, not to be taken in a limiting sense, and the scope of embodiments of the present invention is defined only by the appended claims.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

One or more implementations of the present invention will now be described with reference to the attached drawings, wherein like reference numerals are used to refer to like elements throughout, and wherein the illustrated structures are not necessarily drawn to scale. The terms "die", "semiconductor chip", and "semiconductor die" may be used interchangeable throughout the specification.

Please refer to FIG. 1. FIG. 1 is a schematic, cross-sectional diagram showing an exemplary fan-out package according to one embodiment of the invention. As shown in FIG. 1, the fan-out package 1 may comprise at least two semiconductor dies 11 and 12 electrically coupled to a redistribution layer (RDL) 20. The RDL (or RDL interposer) may be defined by the addition of metal and dielectric layers onto the surface of a wafer to re-route the I/O layout into a looser pitch footprint. Such redistribution requires thin film polymers such as benzocyclobutene (BCB), polyimide (PI) or other organic polymers and metallization such as aluminum (Al) or copper (Cu) to reroute the peripheral pads to an area array configuration.

According to an embodiment of the invention, for example, the RDL 20 may comprise at least one dielectric layer 201 and at least one metal layer 202. The dielectric layer 201 may comprise inorganic materials such as silicon nitride, silicon oxide or the like, but is not limited thereto. According to an embodiment of the invention, the dielectric layer 201 may comprise polymeric materials, but is not limited thereto. The metal layer 202 may comprise aluminum, copper, tungsten, titanium, titanium nitride, or the like. It is to be understood that the metal layer 202 may comprise multi-layer metal traces and the dielectric layer 201 may comprise multi-layer dielectric laminate.

According to an embodiment of the invention, the dies 11 and 12 are flipped such that the active surfaces 11a and 12a face directly toward the RDL 20. On the active surface 11a of the die 11, a plurality of input/output (I/O) pads 111 may be disposed, for example, along a perimeter of its active surface 11a. Likewise, on the active surface 12a of the die 12, a plurality of I/O pads 121 may be disposed, for example, along a perimeter of its active surface. The active surfaces 11a and 12a of the dies 11 and 12 may be conformally covered with a passivation layer 130.

According to an embodiment of the invention, the dies 11 and 12 may comprise terminals 112 and 122 including, but not limited to, metal bumps or micro-bumps on the I/O pads 111 and 121, respectively, disposed on the flipped active surfaces 11a and 12a. According to an embodiment of the invention, the terminals 112 and 122 may comprise a bump pitch of about 20-50 micrometers, but is not limited thereto. Optionally, a planarization layer 210 such as a dielectric layer or a polymeric layer may be applied on the passivation layer 130 and may surround the terminals 112 and 122.

According to an embodiment of the invention, the dies 11 and 12 may be surrounded and supported by an encapsulant such as a molding compound 30. The molding compound 30 may have a lower surface 30a that is flush with a lower surface 210a of the planarization layer 210. The molding compound 30 may have an upper surface 30b that is flush with the rear surfaces 11b and 12b of the dies 11 and 12. The molding compound 30 may be subjected to a curing process during the wafer level packaging process. According to an embodiment of the invention, the molding compound 30 may comprise a mixture of epoxy and silica fillers, but not limited thereto.

The RDL 20 may comprise multiple layers of conductive vias, e.g., $V_1$~$V_3$, via land pads, e.g., $P_2$, $P_3$, multiple layers of conductive traces, e.g., $T_2$ and $T_3$, and bump pads BP, to fan out the I/O pads 111 and 121 to the C4 bumps SB having a looser pitch (e.g., 130-150 micrometers) on the lower surface of the RDL 20. The C4 bumps SB are formed on the bump pads BP, respectively. For the sake of simplicity, only three layers of conductive vias, e.g., $V_1$~$V_3$, and two layers of via land pads, e.g., $P_2$, $P_3$, are demonstrated in FIG. 1. It is to be understood that the number of layers of the vias and land pads may vary depending upon the design requirements.

In FIG. 1, for example, the RDL 20 may comprise a generic interconnect structure IS comprising an intermediate via land pad $P_n$, a cluster of upper conductive vias $V_{n-1}$ abutting the intermediate via land pad $P_n$ and electrically coupling the intermediate via land pad $P_n$ to an upper via land pad $P_{n-1}$, and an array of lower conductive vias $V_n$, electrically coupling the intermediate via land pad $P_n$ with a lower circuit pad $P_{n+1}$. In some embodiments, the lower circuit pad $P_{n+1}$ may be a bump pad, but is not limited thereto.

According to an embodiment of the invention, when implementing the RDL circuit design based on, for example, favorable fan-out wafer-level chip-scale platform, the following criteria need to be considered or met. First, taking into account the electromigration (EM) and IR performance, there are more than one via with respect to each abutting via land pad (or bump pad) in the interconnect structure IS (Criterion A). For example, the cluster of upper conductive vias $V_{n-1}$ may comprise 3-6 vias and the array of lower conductive vias $V_n$ may comprise 4-8 vias, but not limited thereto. Second, to avoid the stress propagating along a vertical direction, the cluster of upper conductive vias $V_{n-1}$ does not overlap with the array of lower conductive vias $V_n$ (Criterion B).

Figure 2:
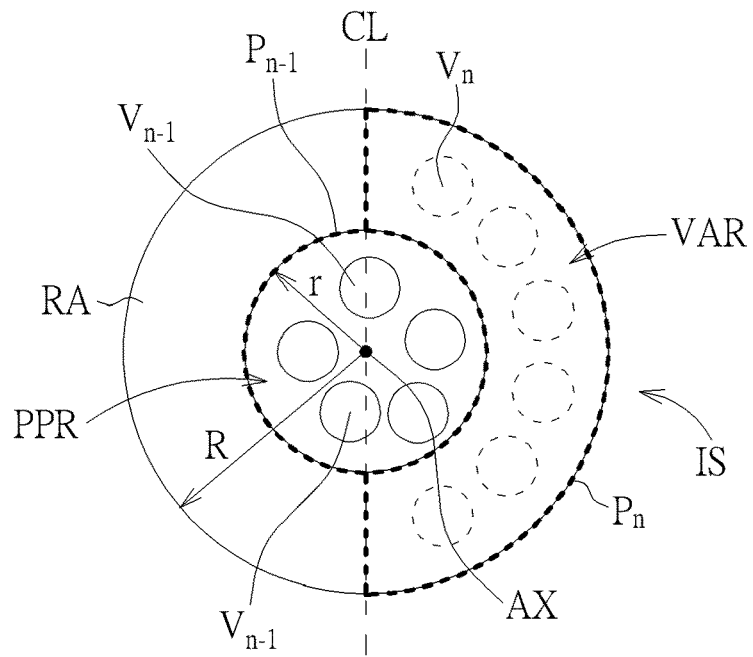
FIG. 2 is a perspective top-down view showing an exemplary interconnect structure comprising an intermediate via land pad, a cluster of upper conductive vias abutting the intermediate via land pad, and an array of lower conductive vias according to an embodiment of the invention.
Figure 3:
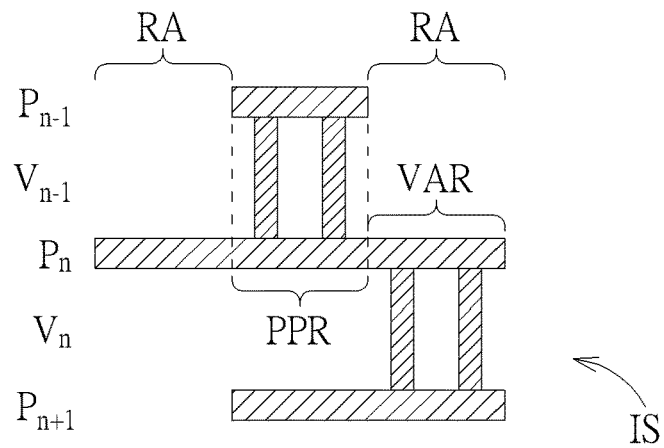
FIG. 3 is a schematic sectional diagram showing the relative position of the intermediate via land pad, the upper conductive vias, and the lower conductive vias in FIG. 2.
Figure 4:
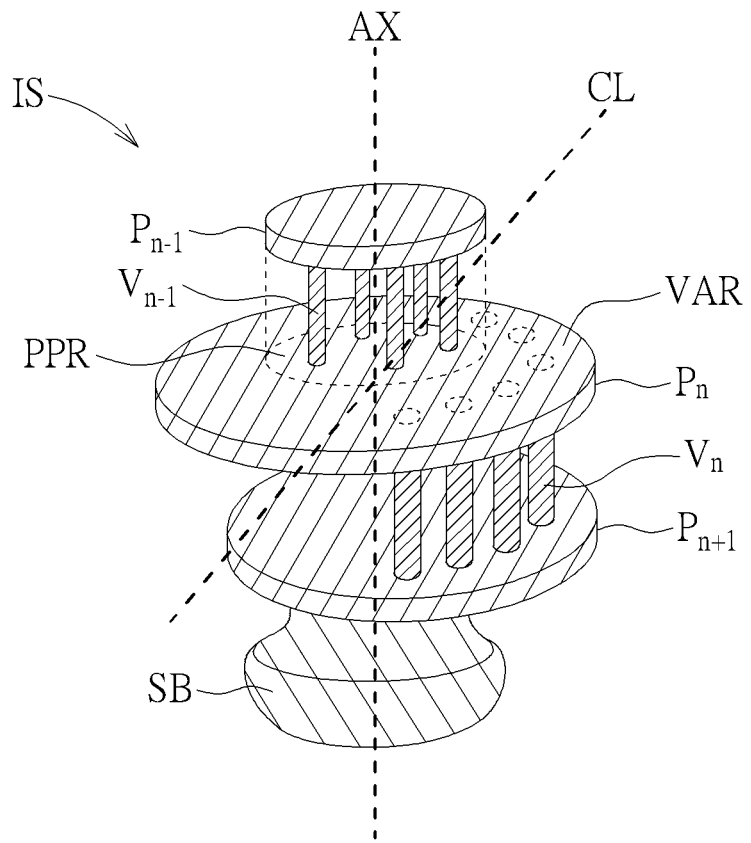
FIG. 4 is a perspective side view of the exemplary interconnect structure in FIG. 2.

Please refer to FIG. 2 to FIG. 4. FIG. 2 is a perspective top-down view showing an exemplary interconnect structure comprising an intermediate via land pad, a cluster of upper conductive vias abutting the intermediate via land pad, and an array of lower conductive vias according to an embodiment of the invention. FIG. 3 is a schematic sectional diagram showing the relative position of the intermediate via land pad, the upper conductive vias, and the lower conductive vias in FIG. 2. FIG. 4 is a perspective side view of the exemplary interconnect structure in FIG. 2, wherein like numeral number or labels designate like layers, regions or elements.

For the sake of clarity, the dielectric layers or polymer layers of the exemplary interconnect structure are ignored. It is to be understood that the shapes of the via land pads are for illustration purposes only. In some embodiments, the via land pads may have a circular shape, a rectangular shape, a square shape, a polygonal shape, an oval shape or an irregular shape, but not limited thereto.

As shown in FIG. 2 to FIG. 4, according to an embodiment, for example, the generic interconnect structure IS comprises an intermediate via land pad $P_n$, a cluster of upper conductive vias $V_{n-1}$ abutting the intermediate via land pad $P_n$ and electrically coupling the intermediate via land pad $P_n$ to an upper via land pad $P_n$ and an array of lower conductive vias $V_n$ electrically coupling the intermediate via land pad $P_n$ with a lower circuit pad $P_{n+1}$. FIG. 4 also shows that an exemplary C4 bump SB may be disposed on a bump pad extended from the lower circuit pad $P_{n+1}$.

It is to be understood that the intermediate via land pad $P_n$ may comprise a circular shape, a rectangular shape, a square shape, a polygonal shape, an oval shape or an irregular shape according to various embodiments. It is to be understood that the upper via land pad $P_{n-1}$ may comprise a circular shape, a rectangular shape, a square shape, a polygonal shape, an oval shape or an irregular shape according to various embodiments. It is to be understood that the intermediate via land pad $P_n$ may have a shape that is different from that of the upper via land pad $P_{n-1}$ according to various embodiments. It is to be understood that the intermediate via land pad $P_n$ and the upper via land pad $P_{n-1}$ may have the same shape according to various embodiments.

According to an embodiment of the invention, for example, the intermediate via land pad $P_n$ and the upper via land pad $P_{n-1}$ may both have a circular shape and may be concentric with respect to a central axis AX when viewed from the above. The cluster of upper conductive vias $V_{n-1}$ may be disposed within a projected area PPR with a radius r on the intermediate via land pad $P_n$ with a radius R. The projected area PPR is substantially equivalent to a top surface area of the upper via land pad $P_{n-1}$. The rest portion of the intermediate via land pad $P_n$ outside the projected area PPR is defined as a ring-shaped area RA with a uniform width that is equal to R-r, which may be divided into two mirror-symmetric horseshoe-shaped (or C-shaped or curved strap-shaped) regions by the central dashed line CL that intersects the central axis AX. According to an embodiment of the invention, one of the two mirror-symmetric horseshoe-shaped regions (one half part of the ring-shaped area RA) is defined as a via array region VAR (indicated by dashed line). According to an embodiment of the invention, the array of lower conductive vias $V_n$ is only allowed to be arranged within an imaginary horseshoe-shaped via array region VAR extending along a perimeter of the intermediate via land pad $P_n$, which is approximately one-half the ring-shaped area RA.

In some cases that the intermediate via land pad $P_n$ and the upper via land pad $P_{n-1}$ are not concentric with respect to the central axis AX when viewed from the above, the Criterion B as previously mentioned above can be met by simply rotating the array of lower conductive vias $V_n$ along with the imaginary via array region VAR about the central axis AX.

Figure 5:
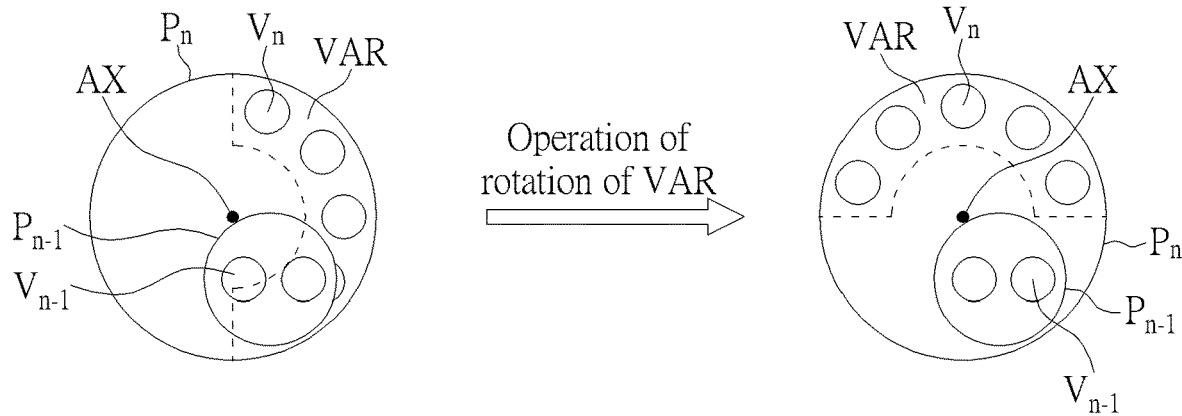
FIG. 5 to FIG. 7 demonstrate exemplary rotation operations of the array of lower conductive vias arranged within the via array region to avoid via overlapping according to some embodiments of the invention.

FIG. 5 shows an exemplary rotation operation of the array of lower conductive vias $V_n$ arranged within the via array region VAR. In FIG. 5, for example, the cluster of upper conductive vias $V_{n-1}$ comprises two conductive vias and the array of lower conductive vias $V_n$ comprises five conductive vias. As shown in FIG. 5, the upper via land pad $P_{n-1}$ is offset from the central axis AX of the intermediate via land pad $P_n$. To avoid overlapping between the lower conductive vias $V_n$ and the upper conductive vias $V_{n-1}$, the array of lower conductive vias $V_n$ along with the imaginary via array region VAR are rotated about the central axis AX by implementing an operation of rotation of VAR.

Figure 6:
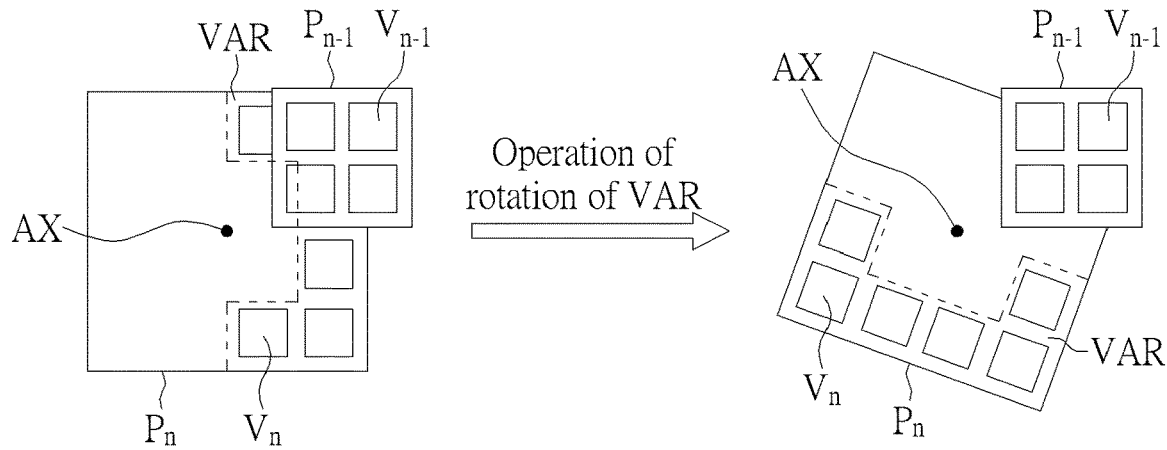

FIG. 6 shows another exemplary rotation operation of the array of lower conductive vias $V_n$ arranged within the via array region VAR. In FIG. 6, for example, the cluster of upper conductive vias $V_{n-1}$ may comprise four conductive vias and the array of lower conductive vias $V_n$ may comprise six conductive vias. The intermediate via land pad $P_n$ and the upper via land pad $P_{n-1}$ may have a rectangular shape. As shown in FIG. 6, the upper via land pad $P_{n-1}$ is offset from the central axis AX of the intermediate via land pad $P_n$. To avoid overlapping between the lower conductive vias $V_n$ and the upper conductive vias $V_{n-1}$, the array of lower conductive vias $V_n$ and the intermediate via land pad $P_n$, are rotated about the central axis AX by implementing an operation of rotation of VAR.

Figure 7:
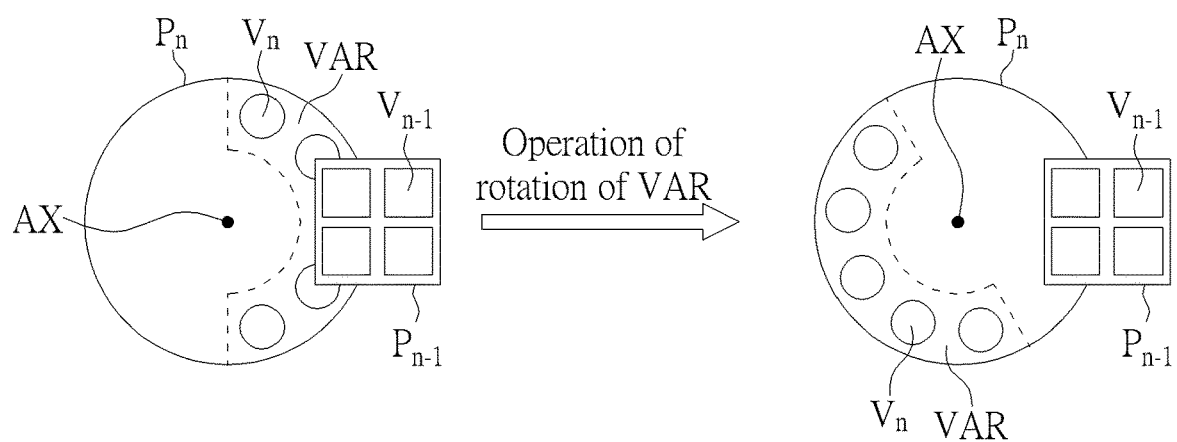

FIG. 7 shows still another exemplary rotation operation of the array of lower conductive vias $V_n$ arranged within the via array region VAR. In FIG. 7, for example, the cluster of upper conductive vias $V_{n-1}$ may comprise four conductive vias and the array of lower conductive vias $V_n$ may comprise five conductive vias. The intermediate via land pad $P_n$ may have a circular shape and the upper via land pad $P_{n-1}$ may have a rectangular shape. As shown in FIG. 7, the upper via land pad $P_{n-1}$ is offset from the central axis AX of the intermediate via land pad $P_n$. To avoid overlapping between the lower conductive vias $V_n$ and the upper conductive vias $V_{n-1}$, the array of lower conductive vias $V_n$ along with the imaginary via array region VAR are rotated about the central axis AX by implementing an operation of rotation of VAR.

It is advantageous to use the present invention because by incorporating the novel via array configuration into the generic interconnect structure when implementing the RDL circuit design, the burden of the circuit designer can be relieved and the runtime can be significantly reduced. Further, the novel via array configuration in the generic interconnect structure makes the RDL circuit design very easy to shift between rules of different minimum C4 bump pitches, e.g., currently min. C4 bump pitch of 130 μm for fan-out wafer-level chip-scale package (FO-WLCSP) and min. C4 bump pitch of 150 μm for CoWoS (Chip-on-Wafer-on-Substrate) technology. This invention provides a flexible approach to the RDL circuit design for different fan-out package technologies.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An interconnect structure for a redistribution layer, comprising:
   an intermediate via land pad;
   a cluster of upper conductive vias abutting the intermediate via land pad and electrically coupling the intermediate via land pad to an upper via land pad; and
   an array of lower conductive vias electrically coupling the intermediate via land pad with a lower circuit pad, wherein the array of lower conductive vias is arranged within a horseshoe-shaped via array region extending along a perimeter of the intermediate via land pad, wherein the intermediate via land pad and the upper via land pad are not concentric with respect to a central axis when viewed from above.

2. The interconnect structure for a redistribution layer according to claim 1, wherein the intermediate via land pad comprises a circular shape, a rectangular shape, a square shape, a polygonal shape, an oval shape or an irregular shape.

3. The interconnect structure for a redistribution layer according to claim 2, wherein the upper via land pad comprises a circular shape, a rectangular shape, a square shape, a polygonal shape, an oval shape or an irregular shape.

4. The interconnect structure for a redistribution layer according to claim 3, wherein the intermediate via land pad and the upper via land pad have the same shape.

5. The interconnect structure for a redistribution layer according to claim 3, wherein the intermediate via land pad and the upper via land pad have different shapes.

6. The interconnect structure for a redistribution layer according to claim 1, wherein the cluster of upper conductive vias is disposed within a projected area of the upper via land pad on the intermediate via land pad.

7. The interconnect structure for a redistribution layer according to claim 6, wherein the projected area is substantially equivalent to a top surface area of the upper via land pad.

8. The interconnect structure for a redistribution layer according to claim 6, wherein a rest portion of the intermediate via land pad outside the projected area is a ring-shaped area with a uniform width.

9. The interconnect structure for a redistribution layer according to claim 8, wherein the ring-shaped area is divided into two mirror-symmetric horseshoe-shaped regions by a central line, and wherein one of the two mirror-symmetric horseshoe-shaped regions is defined as the horseshoe-shaped via array region.

10. The interconnect structure for a redistribution layer according to claim 1, wherein the array of lower conductive vias electrically couples the intermediate via land pad with the lower circuit pad.

11. The interconnect structure for a redistribution layer according to claim 1, wherein the array of lower conductive vias arranged within the horseshoe-shaped via array region does not overlap with the cluster of upper conductive vias.

12. A semiconductor package, comprising:
    at least one semiconductor die;
    a molding compound surrounding the at least one semiconductor die; and
    a redistribution layer disposed on a lower surface of the molding compound, wherein the at least one semiconductor die is electrically connected to an interconnect structure of the redistribution layer, wherein the interconnect structure comprises:
    an intermediate via land pad;
    a cluster of upper conductive vias abutting the intermediate via land pad and electrically coupling the intermediate via land pad to an upper via land pad; and
    an array of lower conductive vias electrically coupling the intermediate via land pad with a lower circuit pad, wherein the array of lower conductive vias is arranged within a horseshoe-shaped via array region extending along a perimeter of the intermediate via land pad, wherein the intermediate via land pad and the upper via land pad are not concentric with respect to a central axis when viewed from above.

13. The semiconductor package according to claim 12, wherein the cluster of upper conductive vias is disposed within a projected area of the upper via land pad on the intermediate via land pad.

14. The semiconductor package according to claim 13, wherein the projected area is substantially equivalent to a top surface area of the upper via land pad.

15. The semiconductor package according to claim 13, wherein a rest portion of the intermediate via land pad outside the projected area is a ring-shaped area with a uniform width.

16. The semiconductor package according to claim 15, wherein the ring-shaped area is divided into two mirror-symmetric horseshoe-shaped regions by a central line, and wherein one of the two mirror-symmetric horseshoe-shaped regions is defined as the horseshoe-shaped via array region.

17. The semiconductor package according to claim 12, wherein the array of lower conductive vias electrically couples the intermediate via land pad with the lower circuit pad.

18. The semiconductor package according to claim 12, wherein the array of lower conductive vias arranged within the horseshoe-shaped via array region does not overlap with the cluster of upper conductive vias.

19. An interconnect structure for a redistribution layer, comprising:
 an intermediate via land pad;
 a cluster of upper conductive vias abutting the intermediate via land pad and electrically coupling the intermediate via land pad to an upper via land pad; and
 an array of lower conductive vias electrically coupling the intermediate via land pad with a lower circuit pad, wherein the cluster of upper conductive vias is disposed within a projected area of the upper via land pad on the intermediate via land pad, wherein the array of lower conductive vias is arranged on a rest portion of the intermediate via land pad outside the projected area and does not overlap with the cluster of upper conductive vias, wherein the intermediate via land pad and the upper via land pad are not concentric with respect to a central axis when viewed from above.

* * * * *